US012628360B2

(12) United States Patent
Kobayashi et al.

(10) Patent No.: US 12,628,360 B2
(45) Date of Patent: May 12, 2026

(54) SEMICONDUCTOR DEVICE WITH PROTECTIVE PROTRUSION

(71) Applicant: Murata Manufacturing Co., Ltd., Kyoto (JP)

(72) Inventors: Kazuya Kobayashi, Kyoto (JP); Atsushi Kurokawa, Kyoto (JP); Hiroaki Tokuya, Kyoto (JP); Isao Obu, Kyoto (JP); Yuichi Saito, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 18/452,668

(22) Filed: Aug. 21, 2023

(65) Prior Publication Data

US 2023/0395542 A1     Dec. 7, 2023

Related U.S. Application Data

(63) Continuation of application No. 16/452,637, filed on Jun. 26, 2019, now Pat. No. 11,735,541.

(30) Foreign Application Priority Data

Jun. 28, 2018     (JP) ................................. 2018-122922
Mar. 25, 2019     (JP) ................................. 2019-056771

(51) Int. Cl.
H10D 1/68          (2025.01)
H10D 1/47          (2025.01)
(Continued)

(52) U.S. Cl.
CPC ................. *H10D 1/68* (2025.01); *H10D 1/47* (2025.01); *H10D 84/204* (2025.01);
(Continued)

(58) Field of Classification Search
CPC ......... H01L 2924/13051; H01L 29/737–7378; H01L 29/66242; H01L 29/66318;
(Continued)

(56) References Cited

U.S. PATENT DOCUMENTS 6,403,436 B1      6/2002   Tanomura
6,833,606 B2 *   12/2004   Nakamura .......... H01L 27/0605
                                                            257/E27.012
(Continued)

FOREIGN PATENT DOCUMENTS

CN             101238570 A        8/2008
JP             2004-311787 A      11/2004
(Continued)

*Primary Examiner* — William B Partridge
*Assistant Examiner* — Gustavo G Ramallo
(74) *Attorney, Agent, or Firm* — McDonald Hopkins LLC

(57)          ABSTRACT

A target element to be protected and a protrusion are arranged on a substrate. An insulating film arranged on the substrate covers the target element and at least a side surface of the protrusion. An electrode pad for external connection is arranged on the insulating film. The electrode pad at least partially overlaps the target element and the protrusion as seen in plan view. A maximum distance between the upper surface of the protrusion and the electrode pad in the height direction is shorter than a maximum distance between the upper surface of the target element and the electrode pad in the height direction.

9 Claims, 12 Drawing Sheets

(51) Int. Cl.

| | |
|---|---|
| *H10D 84/00* | (2025.01) |
| *H10D 84/60* | (2025.01) |
| *H10W 20/43* | (2026.01) |
| *H10W 74/10* | (2026.01) |
| *H10W 72/90* | (2026.01) |

(52) U.S. Cl.
CPC ......... *H10D 84/615* (2025.01); *H10D 84/617* (2025.01); *H10W 20/43* (2026.01); *H10W 74/137* (2026.01); *H10W 74/147* (2026.01); *H10W 72/90* (2026.01); *H10W 72/934* (2026.01); *H10W 72/9413* (2026.01)

(58) Field of Classification Search
CPC .... H10D 10/021; H10D 10/80; H10D 10/821; H10D 10/841; H10D 10/861; H10D 10/881; H10D 10/891
See application file for complete search history.

(56) References Cited

U.S. PATENT DOCUMENTS

| | | | |
|---|---|---|---|
| 2003/0155595 A1 | 8/2003 | Okita | |
| 2005/0161835 A1 | 7/2005 | Maeda | |
| 2008/0169542 A1 | 7/2008 | Suzuki et al. | |
| 2014/0312390 A1* | 10/2014 | Tsai | H01L 24/06 257/197 |
| 2017/0117201 A1 | 4/2017 | Yamada | |
| 2017/0117204 A1 | 4/2017 | McPartlin et al. | |
| 2018/0151647 A1* | 5/2018 | Lee | H10K 50/824 |
| 2018/0309417 A1 | 10/2018 | Obu et al. | |
| 2019/0131175 A1* | 5/2019 | Dungan | H01L 24/05 |

FOREIGN PATENT DOCUMENTS

| | | |
|---|---|---|
| JP | 2005-236277 A | 9/2005 |
| JP | 2006-13276 A | 1/2006 |

* cited by examiner

SEMICONDUCTOR DEVICE WITH PROTECTIVE PROTRUSION

This application is a continuation of U.S. patent application Ser. No. 16/452,637 filed on Jun. 26, 2019, which claims priority from Japanese Patent Application No. 2018-122922 filed on Jun. 28, 2018, and claims priority from Japanese Patent Application No. 2019-056771 filed on Mar. 25, 2019. The content of these applications are incorporated herein by reference in their entireties.

BACKGROUND

The present disclosure relates to semiconductor devices.

A semiconductor device having a pad-on-element (PoE) structure, in which a pad is arranged immediately above an element, such as a transistor, to reduce the size of a semiconductor chip is publicly known (for example, Japanese Unexamined Patent Application Publication No. 2004-311787 (hereinafter referred to as Patent Document 1)). In the semiconductor device disclosed in Patent Document 1, a stripe-shaped interconnection line is disposed below the pad, and therefore the pad has asperities on its surface. The surface asperities of the pad are formed in order to extend an area on which an external stress acts on at the time of, for example, bonding and to relieve the external stress.

BRIEF SUMMARY

Even in the case where the pad has surface asperities and the area on which the external stress acts on is extended, when the circuit element arranged directly under the pad is subjected to the stress, the circuit element may be damaged. The present disclosure provides a semiconductor device capable of reducing damage to a circuit element directly under an electrode pad caused by impact exerted on the electrode pad.

According to embodiments of the present disclosure, a semiconductor device includes a substrate, a target element to be protected, a protrusion, an insulating film, and an electrode pad for external connection. The target element is arranged on the substrate. The protrusion is arranged on the substrate. The insulating film is arranged on the substrate and covers the target element and at least a side surface of the protrusion. The electrode pad is arranged on the insulating film and at least partially overlaps the target element and the protrusion as seen in plan view. A maximum distance between an upper surface of the protrusion and the electrode pad in a height direction is shorter than or equal to a maximum distance between an upper surface of the target element and the electrode pad in the height direction.

When an impact load is exerted on the electrode pad, it propagates through the insulating film to the target element and the protrusion positioned below. Because the impact load is distributed to the target element and the protrusion, the damage to the target element can be reduced.

Other features, elements, characteristics and advantages of the present disclosure will become more apparent from the following detailed description of embodiments of the present disclosure with reference to the attached drawings.

DETAILED DESCRIPTION

First Embodiment

A semiconductor device according to a first embodiment is described with reference to FIGS. 1A and 1B.

Figure 1A:
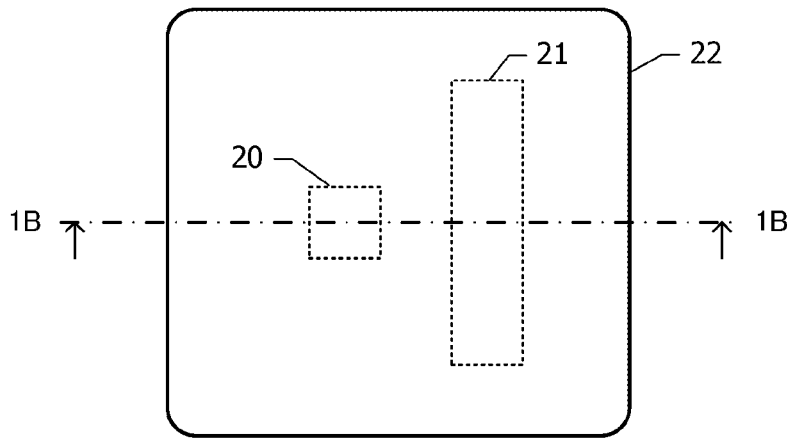
FIG. 1A is a plan view of a semiconductor device according to a first embodiment.

FIG. 1A is a plan view of the semiconductor device according to the first embodiment. A target element 20 to be protected and a protrusion 21 are disposed on a substrate made of a semiconductor. The substrate is overlaid with an insulating film covering the target element 20 and the protrusion 21. An electrode pad 22 for external connection is arranged on the insulating film. The electrode pad 22 overlaps the target element 20 and the protrusion 21 as seen in plan view (in a direction perpendicular to an upper surface of a substrate FIG. 1A illustrates an example in which the target element and the protrusion 21 entirely overlaps the electrode pad 22. The target element 20 and the protrusion 21 may partially extend to the outside of the electrode pad 22.

Figure 1B:
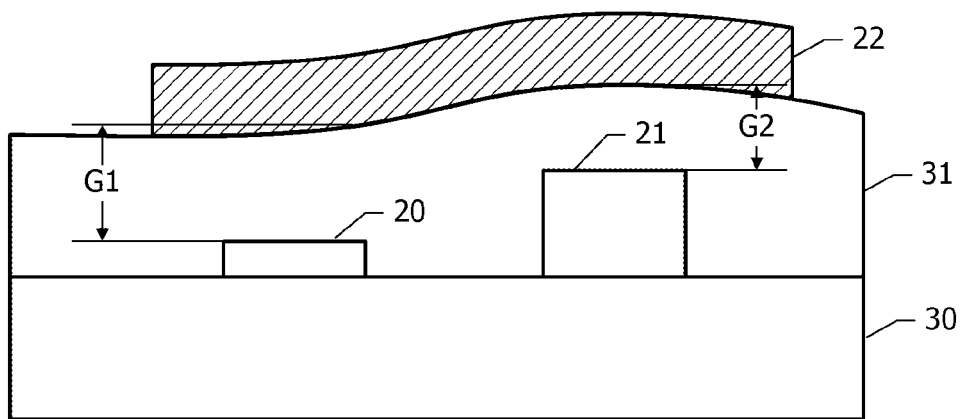
FIG. 1B is a cross-sectional view taken along a dot-and-dash line 1B-1B in FIG. 1A.

FIG. 1B is a cross-sectional view taken along a dot-and-dash line 1B-1B in FIG. 1A. The target element 20 and the protrusion 21 are disposed on a substrate 30 made of a semiconductor. The substrate 30 is overlaid with an insulating film 31. The insulating film 31 covers the target element 20 and the protrusion 21. An upper surface of the insulating film 31 has undulations reflecting the shape of the target element 20 and the protrusion 21. The electrode pad 22 is arranged on the insulating film 31. The target element 20 and the protrusion 21 are arranged directly under the electrode pad 22, and the insulating film 31 is disposed between the electrode pad 22 and each of the target element 20 and the protrusion 21. Such a structure in which a circuit element, such as the target element 20, and the electrode pad 22 are arranged so as to overlap each other can be called a PoE structure.

The protrusion 21 protrudes above the upper surface of the substrate 30. The protrusion 21 includes a side surface rising from the upper surface of the substrate 30 and an upper surface continuous with the side surface at the upper end of the side surface. The substrate 30 and the protrusion 21 may be made of the same semiconductor material, and the border between them may be unclear.

A maximum distance between the upper surface of the target element 20 and the electrode pad 22 in the height direction (a direction perpendicular to the upper surface of the substrate 30) is expressed as G1. A maximum distance between the upper surface of the protrusion 21 and the electrode pad 22 is expressed as G2. The distance G2 is shorter than the distance G1.

Next, excellent advantages of the first embodiment are described.

When an impact load is exerted on the electrode pad 22 at the time of probing or wire-bonding, it propagates through the insulating film 31 to the target element 20 and the protrusion 21. Because the impact load exerted on the electrode pad 22 is distributed to the target element 20 and the protrusion 21, the impact load exerted on the target element 20 is lightened, and thus the stress occurring in the target element 20 is decreased. By the decrease in the stress, the breakdown of the target element 20 can be suppressed, the yields of the semiconductor device can be improved, and its reliability can be enhanced.

When the distance G2 is set to be not longer than the distance G1, the impact load exerted on the electrode pad 22 propagates to the protrusion 21 relatively more easily, whereas it propagates to the target element 20 relatively less easily. Therefore, the advantage of protecting the target element 20 is enhanced.

To enhance the advantage of protecting the target element 20, the protrusion 21 can be near the target element 20. One example layout is one in which an active element and a passive element in an electronic circuit are not arranged between the protrusion 21 and the target element 20.

To obtain a satisfactory advantage of receiving the impact load by the protrusion 21, the difference between the distances G1 and G2 can be large. Moreover, the protrusion 21 can be made of a material having a high Young's modulus. When the protrusion 21 is made of the material having the high Young's modulus, the amount of deformation of the protrusion 21 under the impact load is decreased, and thus the advantage of receiving the impact load is increased. For example, the Young's modulus of the material of the protrusion 21 can be higher than that of the material of the insulating film 31. If the protrusion 21 is a composite member, which is made of a plurality of materials, it can have a structure in which the average value of Young's moduli of the protrusion 21 weighed according to the volume ratio is higher than the Young's modulus of the material of the insulating film 31. If the insulating film 31 has a multilayer structure in which a plurality of films made of different materials are laminated, the average value of Young's moduli weighed according to the volume ratio in a region where it overlaps the electrode pad 22 as seen in plan view may be defined as the Young's modulus of the insulating film 31.

As one example, the target element 20 and the protrusion 21 may include a metal material, an inorganic dielectric material, a semiconductor material, and the like. As for the insulating film 31, an organic insulating material, such as a benzocyclobutene (BCB) or a polyimide, may be used.

Next, semiconductor devices according to variations of the first embodiment are described with reference to FIGS. 2A and 2B.

Figure 2A:
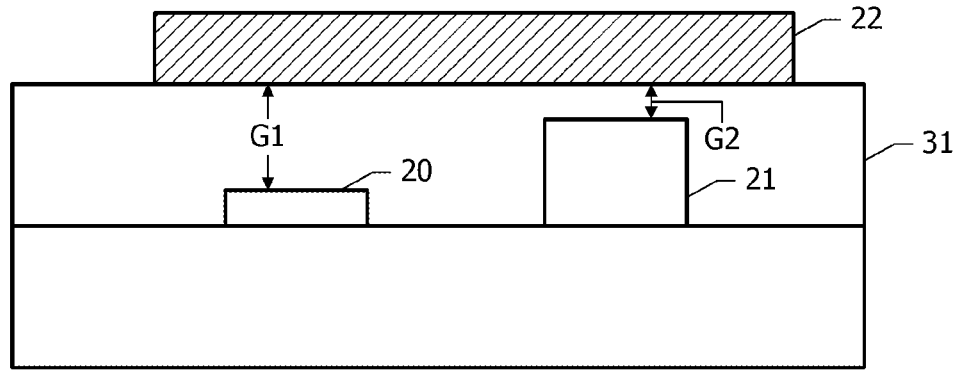
FIGS. 2A and 2B are cross-sectional views of semiconductor devices according to variations of the first embodiment.

FIG. 2A is a cross-sectional view of the semiconductor device according to a variation of the first embodiment. In the first embodiment, the upper surface of the insulating film 31 (FIG. 1B) has undulations reflecting asperities of the lower region. In the variation illustrated in FIG. 2A, the upper surface of the insulating film 31 is nearly (substantially) flat. For example, the insulating film 31 whose upper surface is nearly flat can be formed by the application of a BCB resin by spin-coating. After the insulating film 31 is formed, it may be subjected to flattening. Here, "flat" does not indicate being perfectly flat in a geometrical sense, and it includes, for example, a state of being virtually flat like a surface of a resin film formed when the resin is applied by spin-coating, as described above.

When the upper surface of the insulating film 31 is flattened such that it is substantially parallel with the substrate 30, the difference between the distances G2 and G1 is larger, in comparison with the case where the upper surface of the insulating film 31 has undulations. Thus, the function of protecting the target element 20 can be enhanced.

Figure 2B:
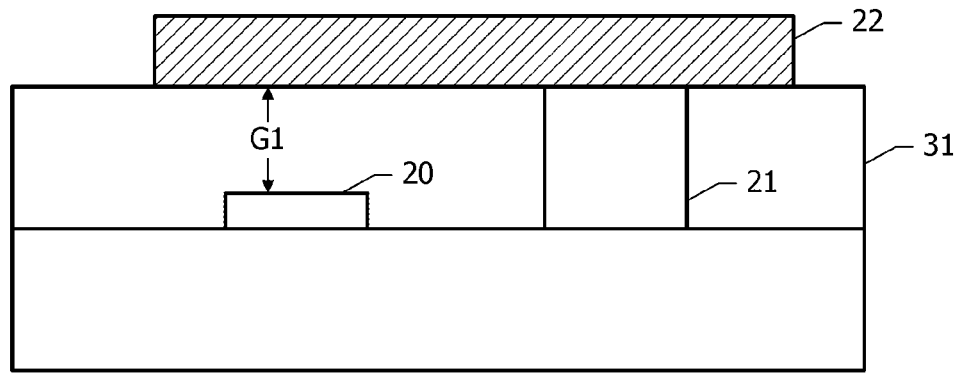

FIG. 2B is a cross-sectional view of the semiconductor device according to another variation of the first embodiment. In the first embodiment, the insulating film 31 is arranged between the protrusion 21 and the electrode pad 22. In the variation illustrated in FIG. 2B, the protrusion 21 and the electrode pad 22 are directly connected to each other such that the insulating film 31 is not interposed therebetween. That structure corresponds to a case where the distance G2 (FIGS. 1B and 2A) is zero.

With the structure in which the protrusion 21 and the electrode pad 22 are directly connected to each other, the function of protecting the target element 20 can be further enhanced.

In the first embodiment, the maximum distance G2 (FIG. 1B) is shorter than the maximum distance G1 (FIG. 1B). The average value of the distances between the upper surface of the protrusion 21 and the electrode pad 22 in the height direction may be smaller than the average value of the distances between the upper surface of the target element 20 and the electrode pad 22 in the height direction. In that case, the protrusion 21 has the function of protecting the target element 20, as in the above-described cases.

Second Embodiment

Next, a semiconductor device according to a second embodiment is described with reference to FIGS. 3A and 3B. The same configurations as those in the semiconductor devices according to the first embodiment and its variations illustrated in the drawings of FIGS. 1A to 2B are not described below.

Figure 3A:
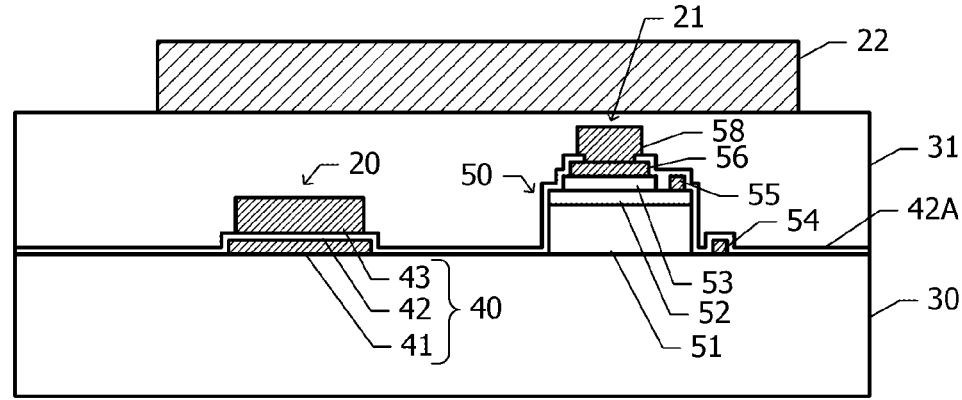
FIG. 3A is a cross-sectional view of a semiconductor device according to a second embodiment.

FIG. 3A is a cross-sectional view of the semiconductor device according to the second embodiment. In the second embodiment, the target element 20 is a capacitor 40, and a heterojunction bipolar transistor (HBT) 50 is used as a portion of the protrusion 21.

The capacitor 40 includes a lower electrode 41, a capacitor dielectric film 42, and an upper electrode 43, which are laminated in sequence from below (from the substrate 30 side). The HBT 50 includes a collector layer 51, a base layer 52, and an emitter layer 53, which are laminated in sequence from below. The collector layer 51, the base layer 52, and the emitter layer 53 are made of a semiconductor epitaxially grown from the substrate 30. The collector layer 51 is connected to a collector electrode 54 arranged on the upper surface of the substrate 30 with a conductive region (not illustrated) in a surface-layer portion of the substrate 30 interposed therebetween. The conductive region in the surface-layer portion of the substrate 30 may be formed of an epitaxially grown film made of, for example, a semiconductor material that may be the same as that of an inner portion of the substrate 30 and that may be of the same conductive type of the collector layer 51. A base electrode 55 is arranged on the base layer 52. An emitter electrode 56 is arranged on the emitter layer 53.

A dielectric film formed by the same process as that for the capacitor dielectric film 42 (hereinafter referred to as covering dielectric film 42A) is arranged so as to extend to the protrusion 21 and covers the side surface of the protrusion 21. One example of the covering dielectric film 42A covers the side surfaces of the collector layer 51, the base layer 52, and the emitter layer 53. An emitter interconnection line 58 is arranged on the emitter electrode 56. The emitter interconnection line 58 extends through an opening in the covering dielectric film 42A and is connected to the emitter electrode 56.

The collector layer 51, the base layer 52, the emitter layer 53, the emitter electrode 56, the emitter interconnection line 58, and the covering dielectric film 42A are used as the protrusion 21. Each of the collector layer 51, the base layer 52, and the emitter layer 53, which are made of a semiconductor, the emitter electrode 56 and the emitter interconnection line 58, which are made of a metal, and the covering dielectric film 42A, which is made of an inorganic insulating material, has a higher Young's modulus than that of the insulating film 31, which is made of an organic insulating material.

The lower electrode 41 may be formed by, for example, the same process as that for forming the collector electrode 54. In that case, the same material is used in the lower electrode 41 and the collector electrode 54, and both have nearly the same thickness. Alternatively, the lower electrode 41 may be formed by the same process as that for forming the base electrode 55 or the emitter electrode 56. The upper electrode 43 may be formed by, for example, the same process as that for forming the emitter interconnection line 58. In that case, the same material is used in the upper electrode 43 and the emitter interconnection line 58, and both have nearly the same thickness.

Figure 3B:
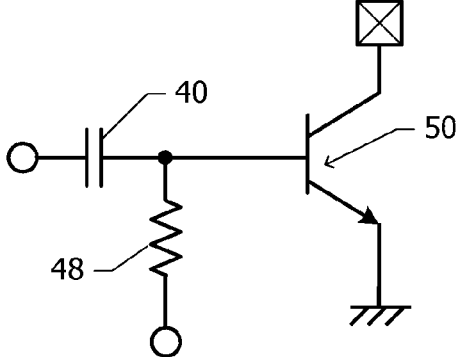
FIG. 3B is an equivalent circuit diagram of a portion of an electronic circuit mounted on a substrate.

FIG. 3B is an equivalent circuit diagram of an electronic circuit mounted on the substrate 30. The capacitor as a direct-current cut filter is connected to the base of the HBT 50. High-frequency input signals are input into the base of the HBT 50 through the capacitor 40. The base of the HBT 50 is also connected to a ballast resistor 48. Base biases are supplied to the HBT 50 through the ballast resistor 48. The ballast resistor 48 is also disposed on the substrate 30.

Next, excellent advantages of the second embodiment are described. In the second embodiment, the damage to the target element 20 by the impact load exerted on the electrode pad 22 can also be suppressed, as in the case of the first embodiment. Moreover, in the second embodiment, the protrusion 21 includes a circuit element being a component of the electronic circuit, that is, the HBT 50. Because the HBT 50 is used as a portion of the protrusion 21, there is no need to have a region dedicated to arranging the protrusion 21. Therefore, the size and cost of the semiconductor device can be reduced.

Next, a semiconductor device according to a variation of the second embodiment is described with reference to FIG. 3C.

Figure 3C:
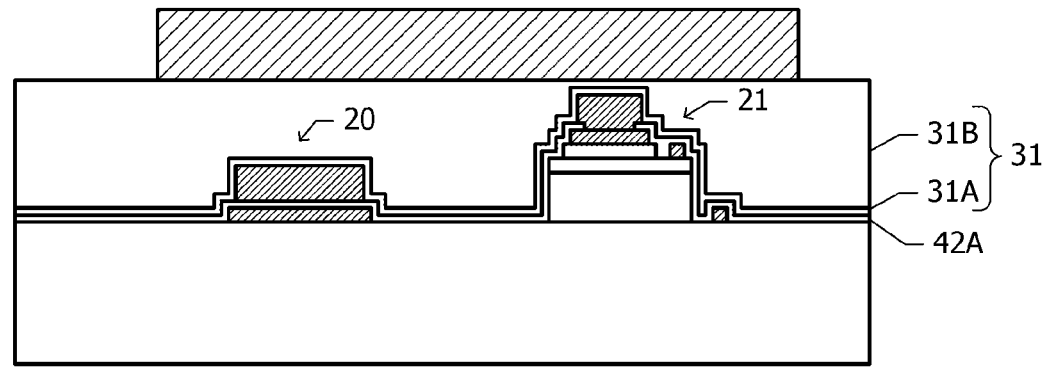
FIG. 3C is a cross-sectional view of a semiconductor device according to a variation of the second embodiment.

FIG. 3C is a cross-sectional view of the semiconductor device according to the variation. In the present variation, the insulating film 31, which covers the target element 20 and the protrusion 21, has a two-layer structure consisting of a lower insulating film 31A and an upper insulating film 31B. The lower insulating film 31A is made of an inorganic insulating material, such as silicon nitride (SiN). The upper insulating film 31B is made of an organic insulating material.

In the present variation, the upper insulating film 31B, which is made of the organic insulating material, has a smaller Young's modulus than that of the inorganic insulating material, and its performance of relieving a stress is high. The lower insulating film 31A, which is made of the inorganic insulating material, has a larger Young's modulus than that of the upper insulating film 31B, and its performance of relieving impact according to the film thickness is high. Because the inorganic insulating material absorbs water less easily than the organic insulating material, the inclusion of the lower insulating film 31A, which is made of the inorganic insulating material, provides the advantage of improving the moisture resistance of the capacitor and other elements.

The insulating film 31 may have a multiple-layer structure consisting of three or more layers. For example, the upper insulating film 31B may be formed of a plurality of organic insulating films made of mutually different organic insulating materials. An inorganic insulating film made of an inorganic insulating material may be disposed between the plurality of organic insulating films.

Next, a semiconductor device according to another variation of the second embodiment is described with reference to FIG. 4A.

Figure 4A:
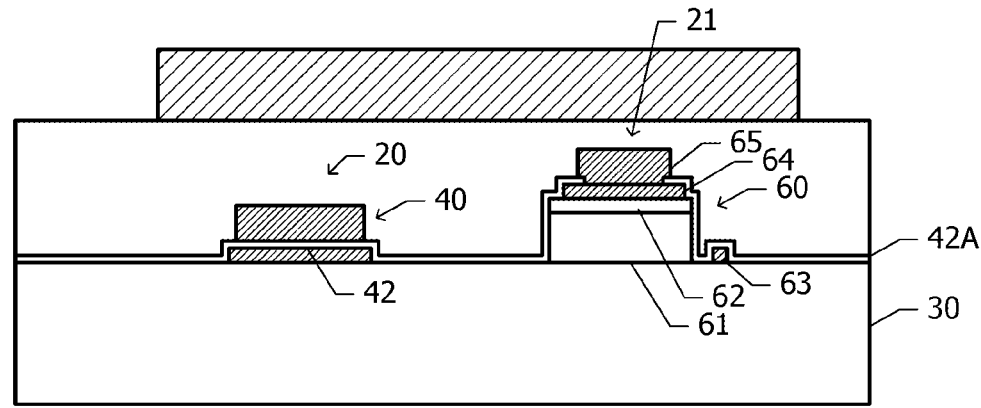
FIGS. 4A and 4B are cross-sectional views of semiconductor devices according to other variations of the second embodiment.

FIG. 4A is a cross-sectional view of the semiconductor device according to the variation of the second embodiment. The configuration of the capacitor 40 is the same as that of the capacitor 40 in the semiconductor device according to the second embodiment (FIG. 3A).

In the present variation, a diode 60 is used as a portion of the protrusion 21. The diode 60 includes an n-type semiconductor layer 61 and a p-type semiconductor layer 62, which are laminated in sequence from below. The n-type semiconductor layer 61 is connected to a cathode electrode 63 disposed on the upper surface of the substrate 30 with a conductive surface-layer portion of the substrate 30 interposed therebetween. An anode electrode 64 is arranged on the p-type semiconductor layer 62. An anode interconnection line 65 is arranged on the anode electrode 64.

In the case where the HBT 50 (FIG. 3A) is disposed on the substrate 30, the n-type semiconductor layer 61 and the p-type semiconductor layer 62 are formed by the same processes as those for the collector layer 51 and the base layer 52 in FIG. 3A, respectively. The cathode electrode 63, the anode electrode 64, and the anode interconnection line 65 are formed by the same processes as those for the collector electrode 54, the base electrode 55, and the emitter interconnection line 58 in FIG. 3A, respectively.

In the variation illustrated in FIG. 4A, the protrusion 21 including the diode 60 has the function of protecting the target element 20 from impact loads.

Next, a semiconductor device according to still another variation of the second embodiment is described with reference to FIG. 4B.

Figure 4B:
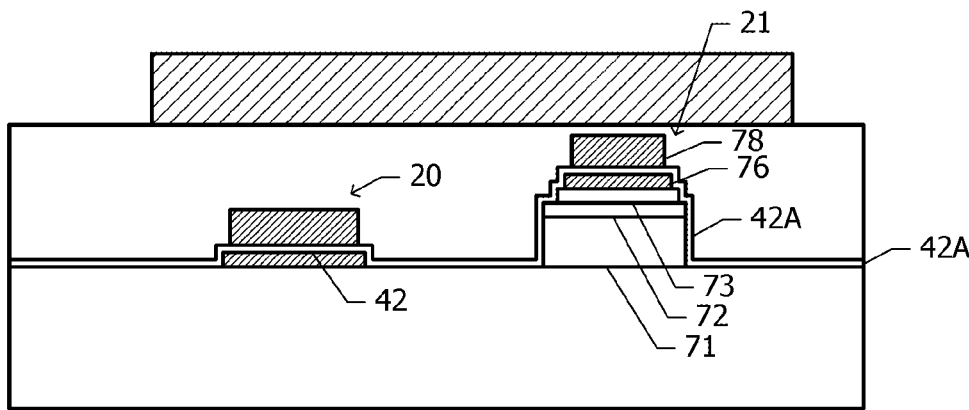

FIG. 4B is a cross-sectional view of the semiconductor device according to the present variation. In the second embodiment (FIG. 3A) and its variation (FIG. 4A), a circuit element, such as a transistor or diode, is used as a portion of the protrusion 21. In the present variation, the protrusion 21 is not electrically connected to the electronic circuit mounted on the substrate 30.

The protrusion 21 has a multilayer structure in which semiconductor layers 71, 72, and 73, a metal layer 76, the covering dielectric film 42A, and a metal layer 78 are laminated in this order. The semiconductor layers 71, 72, and 73 are formed by the same processes as those for the collector layer 51, the base layer 52, and the emitter layer 53 (FIG. 3A), respectively. The metal layers 76 and 78 are formed by the same processes as those for forming the emitter electrode 56 and the emitter interconnection line 58 (FIG. 3A), respectively.

In the present variation, the two-dimensional shape, arrangement, and dimensions of the protrusion 21 are not subject to constraints based on the capability needed for the circuit element in the electronic circuit. Thus, the two-dimensional shape, arrangement, and dimensions of the protrusion 21 can be optimized for the aim of protecting the target element 20.

Next, a semiconductor device according to yet another variation of the second embodiment is described with reference to FIG. 5.

Figure 5:
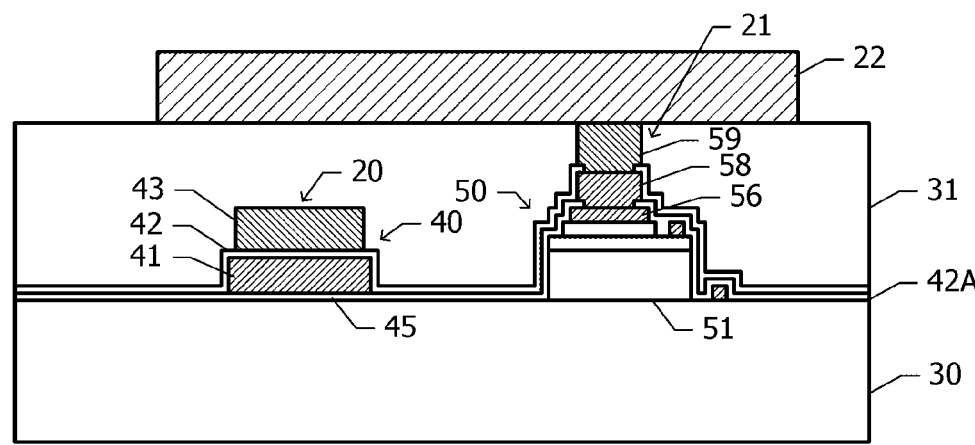
FIG. 5 is a cross-sectional view of a semiconductor device according to still another variation of the second embodiment.

FIG. 5 is a cross-sectional view of the semiconductor device according to the present variation. In the present variation, the protrusion 21 includes the HBT 50 and the emitter interconnection line 58 according to the second embodiment (FIG. 3A) and further includes an emitter interconnection line 59 as the second layer on the emitter interconnection line 58. The second-layer emitter interconnection line 59 is in direct contact with the electrode pad 22. The insulating film 31 covers the side surface of the protrusion 21.

A lower insulating film 45 is arranged under the lower electrode 41 in the capacitor 40 being the target element 20. The lower insulating film 45 extends to the location where the HBT 50 is arranged. The lower insulating film 45 is arranged between the emitter electrode 56 and the emitter interconnection line 58. The emitter interconnection line 58 extends through the opening in the lower insulating film 45 and is connected to the emitter electrode 56. The lower electrode 41 and the upper electrode 43 in the capacitor 40 are formed by the same processes as those for the emitter interconnection line 58 and the second-layer emitter interconnection line 59, respectively. Thus, the covering dielectric film 42A, which is formed by the same process as that for the capacitor dielectric film 42, is arranged between the first-layer emitter interconnection line 58 and the second-layer emitter interconnection line 59. The second-layer emitter interconnection line 59 extends through the opening in the covering dielectric film 42A and is connected to the first-layer emitter interconnection line 58.

In the present variation, as in the case of the variation of the first embodiment illustrated in FIG. 2B, the protrusion 21 is connected directly to the electrode pad 22. This can enhance the advantage of protecting the target element 20.

Third Embodiment

Next, a semiconductor device according to a third embodiment is described with reference to FIG. 6. The same configurations as those in the semiconductor devices according to the first and second embodiments are not described below.

Figure 6:
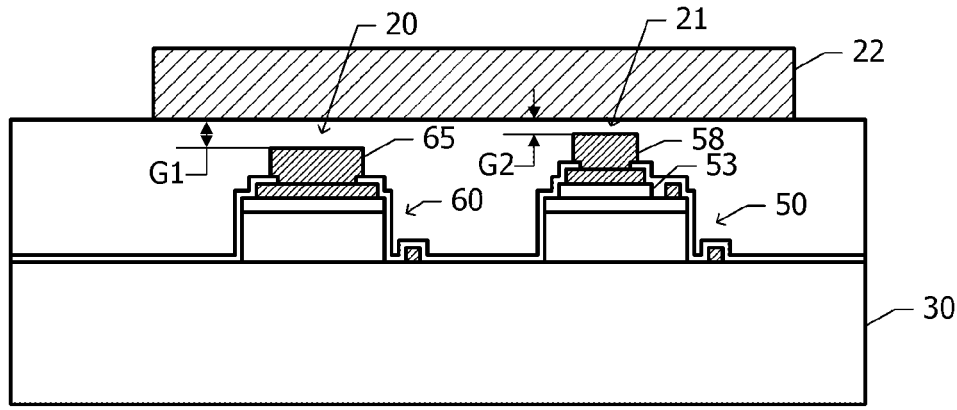
FIG. 6 is a cross-sectional view of a semiconductor device according to a third embodiment.

FIG. 6 is a cross-sectional view of the semiconductor device according to the third embodiment. The semiconductor device according to the third embodiment includes the diode 60 and the HBT 50. The configuration of the diode 60 is the same as that of the diode 60 in the semiconductor device according to the variation (FIG. 4A) of the second embodiment. The configuration of the HBT 50 is the same as that of the HBT 50 in the semiconductor device according to the second embodiment (FIG. 3A).

The diode 60 and the anode interconnection line 65 disposed thereon correspond to the target element 20. The HBT 50 and the emitter interconnection line 58 disposed thereon are used as the protrusion 21. When the diode 60 and the HBT 50 are compared to each other, the diode 60 does not include a semiconductor layer corresponding to the emitter layer 53 in the HBT 50, and thus the diode 60 is lower than the HBT 50. Because the anode interconnection line 65 and the emitter interconnection line 58 are formed by the same process, they have the same thickness. Accordingly, the maximum distance G2 between the upper surface of the protrusion 21 (upper surface of the emitter interconnection line 58) and the electrode pad 22 is shorter than the maximum distance G1 between the upper surface of the target element 20 (upper surface of the anode interconnection line 65) and the electrode pad 22. Hence, the protrusion 21 including the HBT 50 has the function of protecting the target element 20 including the diode 60.

Fourth Embodiment

Figure 7A:
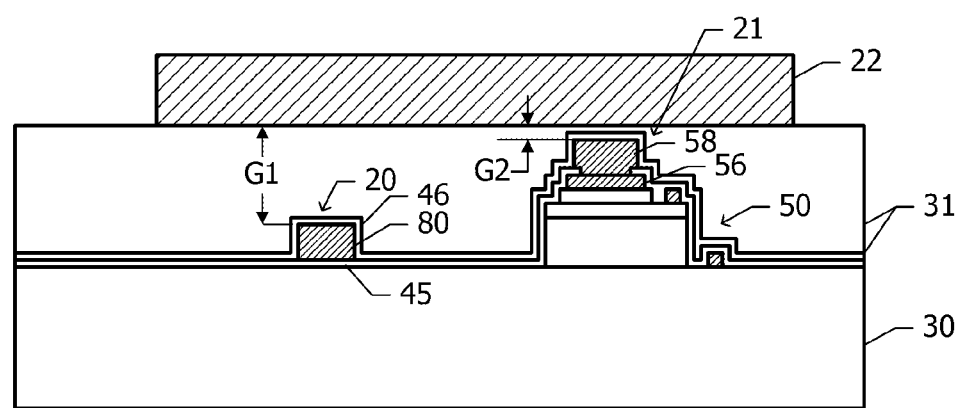
FIG. 7A is a cross-sectional view of a semiconductor device according to a fourth embodiment.

Next, a semiconductor device according to a fourth embodiment is described with reference to FIG. 7A. The same configurations as those in the semiconductor device according to each of the first to third embodiments are not described below. FIG. 7A is a cross-sectional view of the semiconductor device according to the fourth embodiment. An interconnection line 80 and the HBT 50 are arranged on the substrate 30. The configuration of the HBT 50 is the same as that of the HBT 50 in the semiconductor device according to the second embodiment (FIG. 3A). The lower insulating film 45 is arranged between the interconnection line 80 and the substrate 30. The lower insulating film 45 extends to the location where the HBT 50 is arranged. The lower insulating film 45 is arranged between the emitter electrode 56 in the HBT 50 and the emitter interconnection line 58 disposed thereon. The lower insulating film 45 has an opening for allowing the emitter electrode 56 and the emitter interconnection line 58 to be connected therethrough. The interconnection line 80 may be formed by, for example, the same process as that for the emitter interconnection line 58.

The interconnection line 80 and the HBT 50 are covered by an upper insulating film 46. An inorganic insulating material, such as silicon nitride (SiN), is used in the lower insulating film 45 and the upper insulating film 46. The upper insulating film 46 is overlaid with an organic insulating film. This organic insulating film and the upper insulating film 46 correspond to the insulating film 31 in the semiconductor device according to the first embodiment (FIG. 1B).

The interconnection line 80 corresponds to the target element 20. The HBT 50, the lower insulating film 45, which covers it, and the emitter interconnection line 58, which is disposed thereon, are used as the protrusion 21. In the first embodiment illustrated in FIG. 1A, the target element 20 is arranged inside the electrode pad 22 as seen in plan view. In contrast, the interconnection line 80 extends to the outside of the electrode pad 22 as seen in plan view. In that case, the portion where the interconnection line 80 overlaps the electrode pad 22 as seen in plan view may be considered to be the target element 20.

Next, excellent advantages of the fourth embodiment are described.

In the fourth embodiment, because the protrusion 21 including the HBT 50 is near the interconnection line 80, the interconnection line 80 can be protected from impact loads exerted on the electrode pad 22.

Next, a semiconductor device according to a variation of the fourth embodiment is described with reference to FIG. 7B.

Figure 7B:
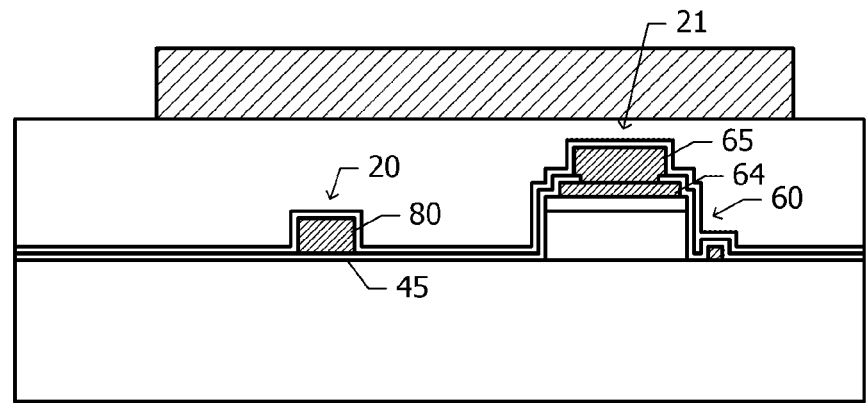
FIG. 7B is a cross-sectional view of a semiconductor device according to a variation of the fourth embodiment.

FIG. 7B is a cross-sectional view of the semiconductor device according to the present variation. In the present variation, the protrusion 21 includes the diode 60, instead of the HBT 50. The configuration of the diode 60 is the same as that of the diode 60 in the semiconductor device according to the variation (FIG. 4A) of the second embodiment. The lower insulating film 45 arranged under the interconnection line 80 extends in the in-plane direction of the substrate 30 and covers the diode 60. The lower insulating film 45 is arranged between the anode electrode 64 in the diode 60 and the anode interconnection line 65 disposed thereon. The anode interconnection line 65 extends through the opening in the lower insulating film 45 and is connected to the anode electrode 64. In the present variation, the diode 60, the lower insulating film 45, which covers the diode 60, and the anode interconnection line 65 are used as the protrusion 21.

In the variation illustrated in FIG. 7B, as in the case of the fourth embodiment, the interconnection line 80 corresponding to the target element 20 can be protected from impact loads exerted on the electrode pad 22.

Fifth Embodiment

Next, semiconductor devices according to a fifth embodiment and its variations are described with reference to the drawings of FIGS. 8A to 8C. The same configurations as those in the semiconductor device according to the fourth embodiment (FIG. 7A) are not described below.

Figure 8A:
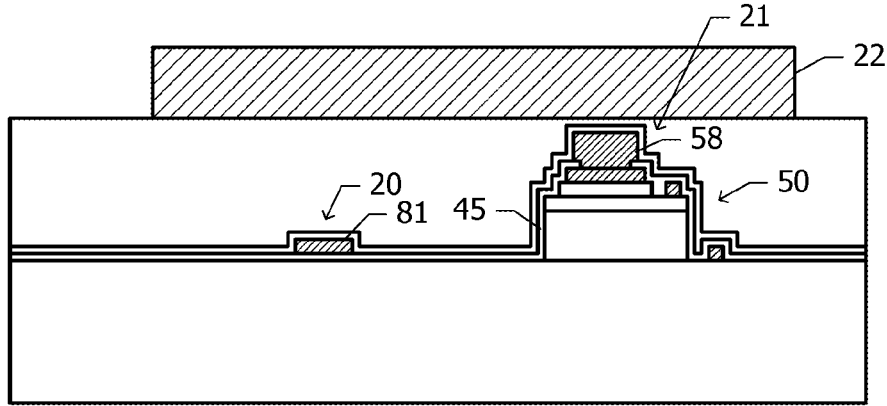
FIG. 8A is a cross-sectional view of a semiconductor device according to a fifth embodiment.

FIG. 8A is a cross-sectional view of the semiconductor device according to the fifth embodiment. In the semiconductor device according to the fifth embodiment, the interconnection line 80 in the semiconductor device according to the fourth embodiment (FIG. 7A) is replaced with a thin-film resistance element 81. The thin-film resistance element 81 corresponds to the target element 20. The thin-film resistance element 81 may be used as, for example, the ballast resistor 48 (FIG. 3B). The HBT 50, the lower insulating film 45, and the emitter interconnection line 58 are used as the protrusion 21.

Figure 8B:
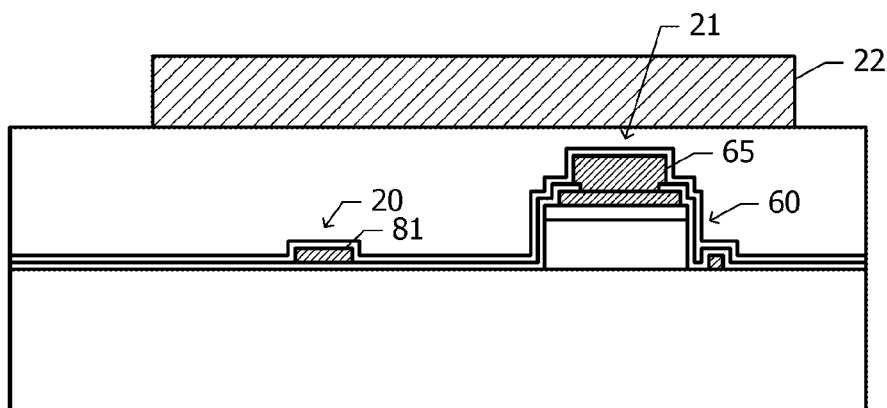
FIGS. 8B and 8C are cross-sectional views of semiconductor devices according to variations of the fifth embodiment.

FIG. 8B is a cross-sectional view of the semiconductor device according to a variation of the fifth embodiment. In the present variation, in place of the HBT 50 and the emitter interconnection line 58 in the semiconductor device according to the fifth embodiment (FIG. 8A), the diode 60 and the anode interconnection line 65 are used as the protrusion 21.

Figure 8C:
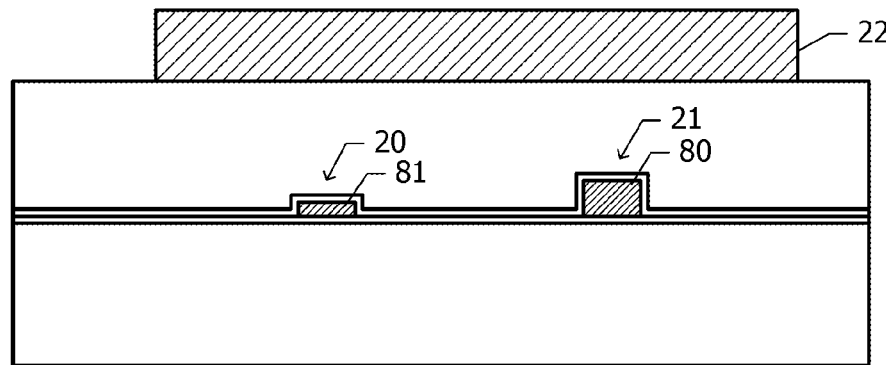

FIG. 8C is a cross-sectional view of the semiconductor device according to another variation of the fifth embodiment. In the present variation, in place of the HBT 50 and the emitter interconnection line 58 in the semiconductor device according to the fifth embodiment (FIG. 8A), the interconnection line 80 is used as the protrusion 21.

In the fifth embodiment and its variations, the protrusion 21 can protect the target element 20, to which the thin-film resistance element 81 corresponds, from impact loads exerted on the electrode pad 22.

Sixth Embodiment

Next, semiconductor devices according to a sixth embodiment and its variations are described with reference to the drawings of FIGS. 9A to 9C. The same configurations as those in the semiconductor device according to the fourth embodiment (FIG. 7A) are not described below.

Figure 9A:
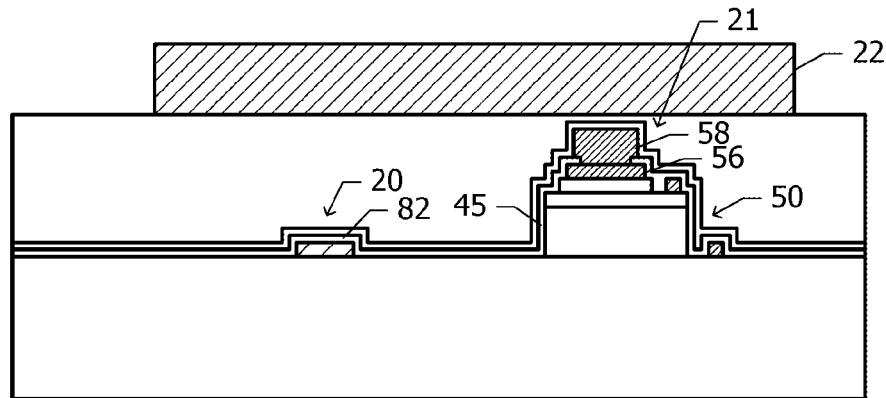
FIG. 9A is a cross-sectional view of a semiconductor device according to a sixth embodiment.

FIG. 9A is a cross-sectional view of the semiconductor device according to the sixth embodiment. In the semiconductor device according to the sixth embodiment, the interconnection line 80 in the semiconductor device according to the fourth embodiment (FIG. 7A) is replaced with a semiconductor resistance element 82. The semiconductor resistance element 82 corresponds to the target element 20. The semiconductor resistance element 82 is arranged directly on the substrate 30. The lower insulating film 45 arranged between the emitter electrode 56 and the emitter interconnection line 58 extends to the location where the semiconductor resistance element 82 is arranged and covers the semiconductor resistance element 82. The HBT 50, the lower insulating film 45, and the emitter interconnection line 58 are used as the protrusion 21.

Figure 9B:
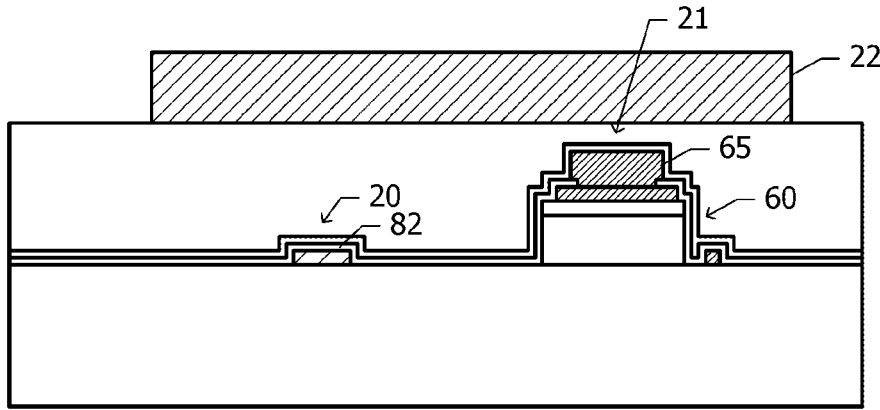
FIGS. 9B and 9C are cross-sectional views of semiconductor devices according to variations of the sixth embodiment.

FIG. 9B is a cross-sectional view of the semiconductor device according to a variation of the sixth embodiment. In the present variation, in place of the HBT 50 and the emitter interconnection line 58 in the semiconductor device according to the sixth embodiment (FIG. 9A), the diode 60 and the anode interconnection line 65 are used as the protrusion 21.

Figure 9C:
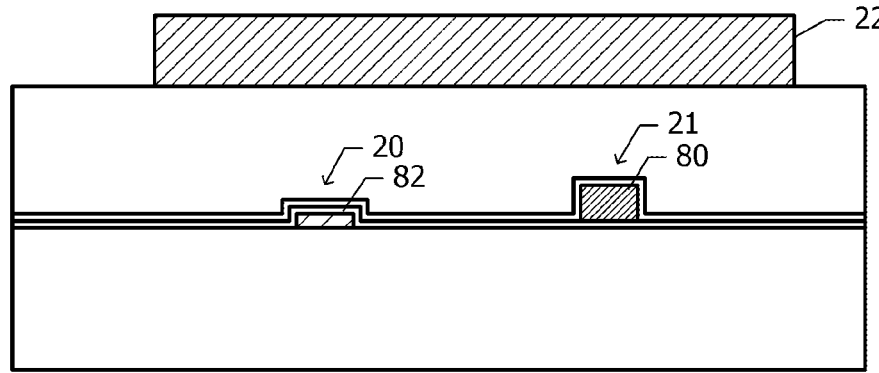

FIG. 9C is a cross-sectional view of the semiconductor device according to another variation of the sixth embodiment. In the present variation, in place of the HBT 50 and the emitter interconnection line 58 in the semiconductor device according to the sixth embodiment (FIG. 9A), the interconnection line 80 is used as the protrusion 21.

In the sixth embodiment and its variations, the protrusion 21 can protect the target element 20, which the semiconductor resistance element 82 corresponds, from impact loads exerted on the electrode pad 22.

Seventh Embodiment

Next, a semiconductor device according to a seventh embodiment is described with reference to FIGS. 10A and 10B. The same configurations as those in the semiconductor device according to each of the first to sixth embodiments are not described below.

Figure 10A:
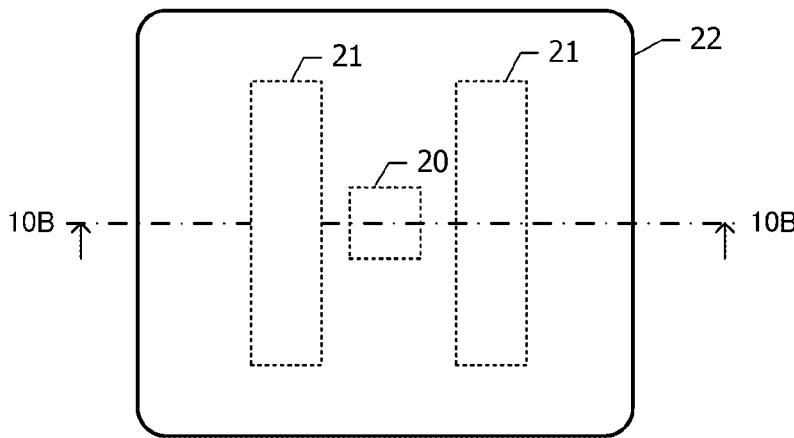
FIG. 10A is a plan view of a semiconductor device according to a seventh embodiment.

FIG. 10A is a plan view of the semiconductor device according to the seventh embodiment. In the first embodiment illustrated in FIG. 1A, the single protrusion 21 is arranged alongside the target element 20. In the seventh embodiment, the protrusion 21 is arranged on each of opposite sides of the target element 20. In other words, the two protrusions 21 are arranged so as to sandwich the target element 20 in one direction. The two protrusions 21 and the target element 20 arranged therebetween are arranged inside the single electrode pad 22 as seen in plan view.

Figure 10B:
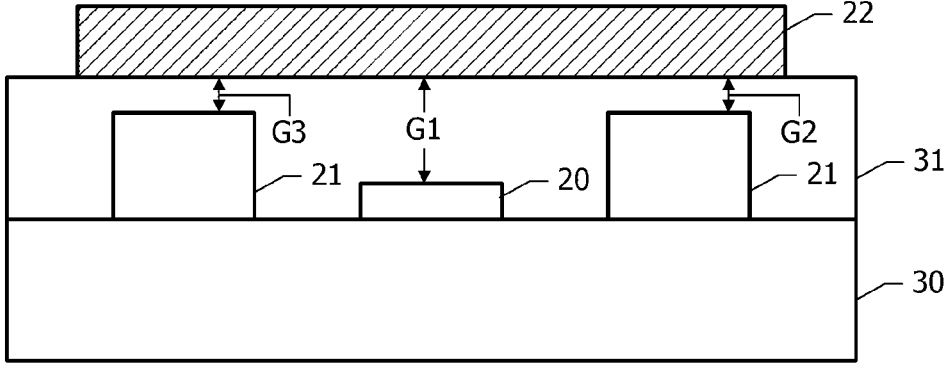
FIG. 10B is a cross-sectional view taken along a dot-and-dash line 10B-10B in FIG. 10A.

FIG. 10B is a cross-sectional view taken along a dot-and-dash line 10B-10B in FIG. 10A. The target element 20 is arranged on the substrate 30, and the protrusion 21 is arranged on each of opposite sides of the target element 20. The maximum distance between the upper surface of a first one of the protrusions 21 and the electrode pad 22 is expressed as G2, and the maximum distance between the upper surface of a second one of the protrusions 21 and the electrode pad 22 is expressed as G3. Both of the distances G2 and G3 are shorter than the distance G1.

The first and second protrusions 21 may have the same structure or different structures. For example, both of the protrusions 21 may include the HBT 50 (FIG. 3A). Alternatively, the first protrusion 21 may include the HBT 50 (FIG. 3A), and the second protrusion 21 may include the diode 60 (FIG. 4A).

Next, excellent advantages of the seventh embodiment are described.

In the seventh embodiment, because the protrusion 21 is arranged on each of opposite sides of the target element 20, in comparison with the configurations in which the single protrusion 21 is arranged, the advantage of protecting the target element 20 from impact loads exerted on the electrode pad 22 can be enhanced.

Next, semiconductor devices according to variations of the seventh embodiment are described with reference to FIGS. 11A to 12B.

The drawings of FIGS. 11A to 12B are plan views of the semiconductor devices according to the variations of the seventh embodiment. In each of the drawings of FIGS. 11A to 12B, the protrusions 21 are hatched.

Figure 11A:
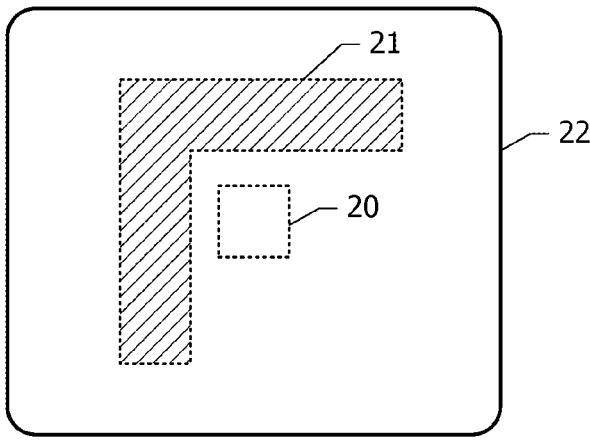
FIGS. 11A, 11B, and 11C are plan views of semiconductor devices according to variations of the seventh embodiment.
Figure 11B:
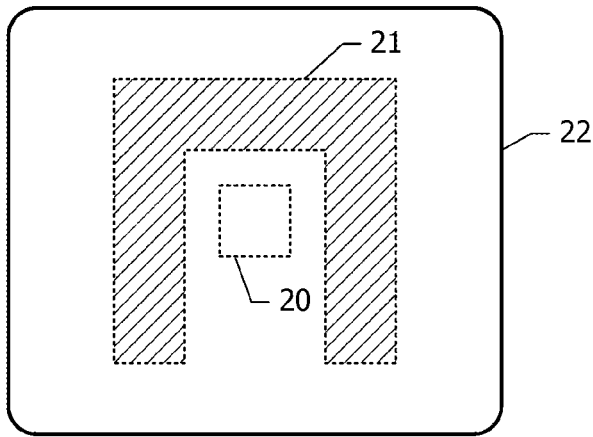

In the variation illustrated in FIG. 11A, the target element 20 is surrounded on two sides by the protrusion 21 in a substantially L-shaped arrangement as seen in plan view. In the variation illustrated in FIG. 11B, the target element 20 is surrounded on three sides by the protrusion 21 in a substantially U-shaped arrangement as seen in plan view. In the variation illustrated in FIG. 11C, the target element 20 is continuously surrounded on four sides by the protrusion 21 as seen in plan view.

Figure 12A:
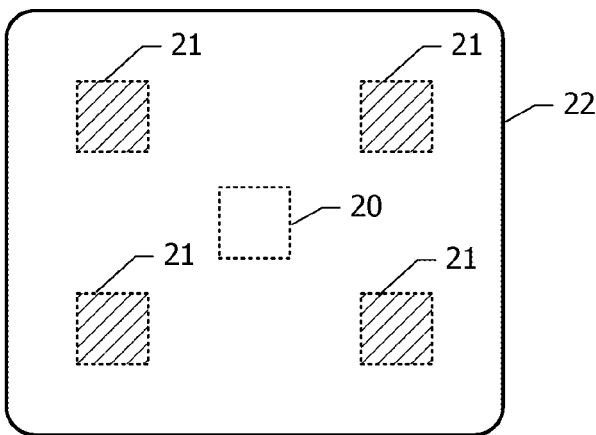
FIGS. 12A and 12B are plan views of semiconductor devices according to variations of the seventh embodiment.
Figure 12B:
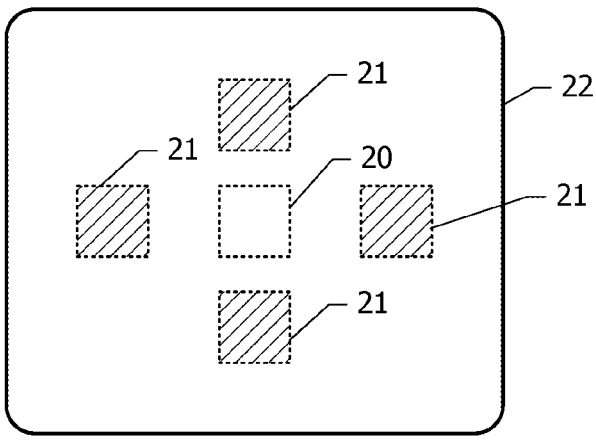

In the variations illustrated in FIGS. 12A and 12B, a plurality of protrusions 21 spaced apart from each other surround the target element 20. In other words, the plurality of protrusions 21 are arranged around the target element 20. For example, in the variation illustrated in FIG. 12A, the protrusions 21 are arranged at the locations of four vertices of a substantially square or rectangle centered around the location of the target element 20. For example, in the variation illustrated in FIG. 12B, the protrusions 21 are arranged at the locations of four vertices of a substantially rhombus centered around the location of the target element 20.

In all of the variations illustrated in the drawings of FIGS. 11A to 12B, in comparison with the configurations in which the single protrusion 21 is disposed on one side of the target element 20, the advantage of protecting the target element 20 can be enhanced.

Figure 11C:
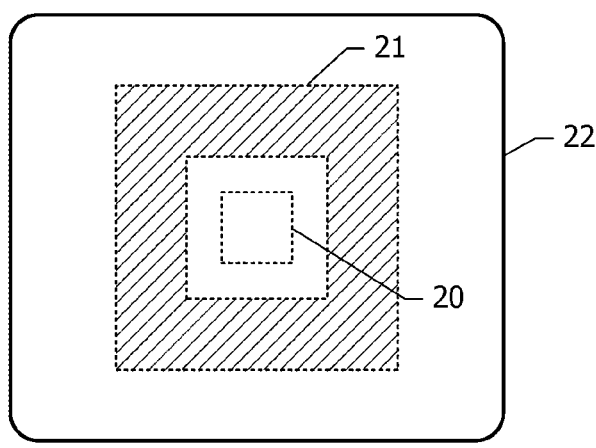

In terms of protection of the target element 20, the area of the protrusion 21 may be large, as in the variation illustrated in FIG. 11C. In terms of the placement of the interconnection line connected to the protrusion 21, the protrusion 21 may not be arranged in the direction in which the interconnection line extends from the target element 20. Accordingly, in terms of the placement of the interconnection line, the variations illustrated in FIGS. 11A and 11B may be preferable to the variation illustrated in FIG. 11C.

Typically, the interconnection line is placed substantially in parallel with either one of two directions substantially orthogonal to each other. The cases where the interconnection line is placed substantially in parallel with either one of the horizontal and vertical directions in FIGS. 12A and 12B are discussed below. As for the variation illustrated in FIG. 12B, the interconnection line from the target element 20 needs to be bent in a crank shape in order to be placed so as to avoid the protrusion 21. As for the variation illustrated in FIG. 12A, the interconnection line can be extended linearly from the target element 20. Therefore, in terms of the placement of the interconnection line, the variation illustrated in FIG. 12A may be preferable to the variation illustrated in FIG. 12B.

The target element 20, which is arranged in a nearly central portion of the electrode pad 22 as seen in plan view in each of the drawings of FIGS. 10A and 11A to 12B, is not restricted to the central portion of the electrode pad 22. If the target element 20 is arranged near the edge of the electrode pad 22, when the protrusion 21 is arranged near the target element 20, the advantage of protecting the target element 20 is obtainable, as in the cases of the seventh embodiment and its variations. The target element 20 and the protrusion 21 may partially extend to the outside of the electrode pad 22.

Eighth Embodiment

Next, a semiconductor device according to an eighth embodiment is described with reference to FIG. 13A. The same configurations as those in the semiconductor device according to the first embodiment (FIGS. 1A and 1B) are not described below.

Figure 13A:
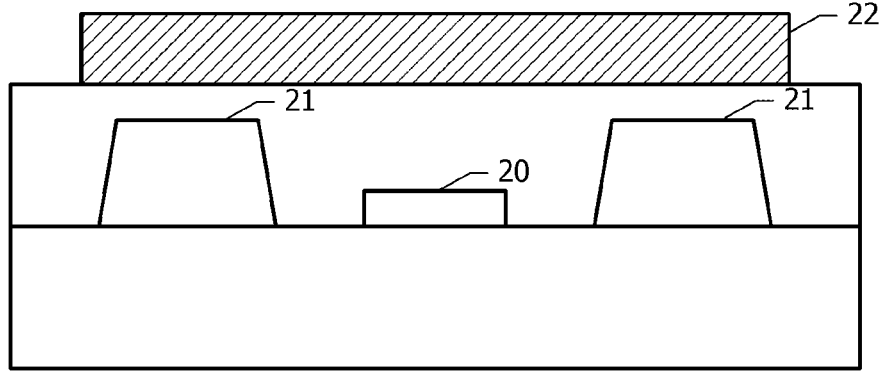
FIG. 13A is a cross-sectional view of a semiconductor device according to an eighth embodiment.

FIG. 13A is a cross-sectional view of the semiconductor device according to the eighth embodiment. In the eighth embodiment, the protrusion 21 is arranged on each of opposite sides of the target element 20. In the first embodiment illustrated in FIG. 1B, the side surface of the protrusion 21 is nearly perpendicular to the upper surface of the substrate 30. In the eighth embodiment, the side surface of the protrusion 21 is inclined to the upper surface of the substrate 30. One example shape of a vertical section of the protrusion 21 may be a substantially trapezoid.

Figure 13B:
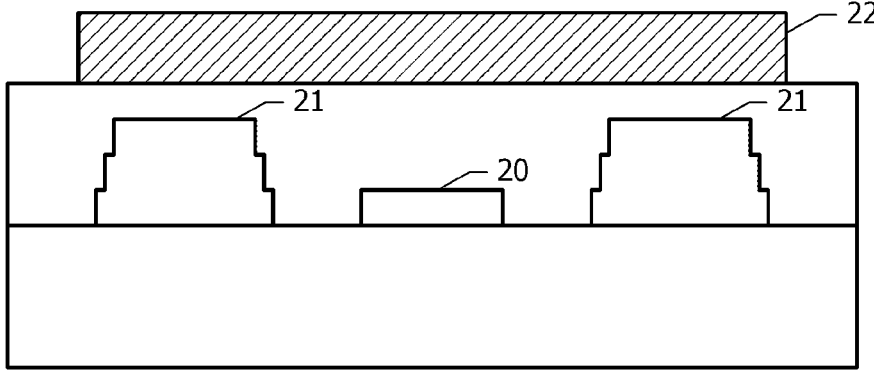
FIG. 13B is a cross-sectional view of a semiconductor device according to a variation of the eighth embodiment.

FIG. 13B is a cross-sectional view of a semiconductor device according to a variation of the eighth embodiment. In the present variation, the side surface of the protrusion 21 has a stepped shape.

In the eighth embodiment, in which the side surface of the protrusion 21 is inclined or stepped, the advantage of protecting the target element 20 is also obtainable, as in the case of the first embodiment. For example, when the area of the upper surface of the protrusion 21 is the same, if the side surface is inclined or stepped, the volume of the protrusion 21 is increased. With the increased volume of the protrusion 21, the impact resistance is increased, and the advantage of enhancing the advantage of protecting the target element 20 is obtainable.

The above-described embodiments are illustrative, and the configurations in different embodiments can be replaced or combined in part. Similar operational effects produced by similar configurations in a plurality of embodiments are not mentioned individually for each embodiment. Furthermore, the present disclosure is not restricted to the above-described embodiments. For example, it is obvious for those skilled in the art that various changes, improvements, combinations, and the like can be made.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:

a substrate;

a target element to be protected arranged on the substrate;

a protrusion arranged on the substrate;

an insulating film arranged on the substrate and covering the target element and at least a side surface of the protrusion; and an electrode pad for external connection arranged on the insulating film, the electrode pad at least partially overlapping both the target element and the protrusion as seen in plan view, wherein a maximum distance between an uppermost surface of the protrusion and the electrode pad in a height direction is shorter than a maximum distance between an uppermost surface of the target element and the electrode pad in the height direction, and wherein the uppermost surface of the protrusion is connected to the electrode pad while the uppermost surface of the target element is not connected to the electrode pad.

2. The semiconductor device according to claim 1, further comprising an interconnection line arranged on the electrode, wherein the electrode pad is connected to the interconnection line.

3. The semiconductor device according to claim 1, further comprising a circuit element arranged on the substrate, the circuit element being a component of an electronic circuit, wherein the protrusion includes the circuit element therein.

4. The semiconductor device according to claim 1, wherein an upper surface of the insulating film is substantially flat.

5. The semiconductor device according to claim 1, wherein the protrusion is arranged on at least each of opposite sides of the target element as seen in plan view.

6. The semiconductor device according to claim 1, wherein the target element is a capacitor.

7. The semiconductor device according to claim 1, wherein the target element is a resistor.

8. The semiconductor device according to claim 1, wherein a side face of the protrusion is inclined.

9. The semiconductor device according to claim 1, wherein the protrusion is arranged on each of opposite sides of the target element.

* * * * *